United States Patent
Lee

(10) Patent No.: US 10,651,059 B2
(45) Date of Patent: May 12, 2020

(54) APPARATUS AND METHOD FOR TREATING SUBSTRATE

(71) Applicant: SEMES CO., LTD., Chungcheongnam-do (KR)

(72) Inventor: Judong Lee, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 16/131,587

(22) Filed: Sep. 14, 2018

(65) Prior Publication Data
US 2019/0103292 A1   Apr. 4, 2019

(30) Foreign Application Priority Data

Sep. 29, 2017   (KR) .................. 10-2017-0127508

(51) Int. Cl.
| | | |
|---|---|---|
| *H01L 21/67* | (2006.01) | |
| *H01L 21/02* | (2006.01) | |
| *H01L 21/687* | (2006.01) | |
| *B08B 3/02* | (2006.01) | |

(52) U.S. Cl.
CPC .......... *H01L 21/67051* (2013.01); *B08B 3/02* (2013.01); *H01L 21/02057* (2013.01); *H01L 21/67017* (2013.01); *H01L 21/67126* (2013.01); *H01L 21/68764* (2013.01)

(58) Field of Classification Search
None
See application file for complete search history.

(56) References Cited

FOREIGN PATENT DOCUMENTS

| | | |
|---|---|---|
| JP | 2015-177090 A | 10/2015 |
| KR | 10-1112511 B1 | 2/2012 |
| KR | 10-1124447 B1 | 3/2012 |
| KR | 10-2014-0089216 A | 7/2014 |
| KR | 10-2015-0069510 A | 6/2015 |
| KR | 10-2015-0125586 A | 11/2015 |
| KR | 10-2017-0018927 A | 2/2017 |

OTHER PUBLICATIONS

Machine Translation of JP2015-177090 by Miura Atsuyasu, published Oct. 5, 2015.*

* cited by examiner

*Primary Examiner* — Mikhail Kornakov
*Assistant Examiner* — Ryan L. Coleman
(74) *Attorney, Agent, or Firm* — Li & Cai Intellectual Property (USA) Office

(57) ABSTRACT

Provided are an apparatus and a method for supplying a liquid. An apparatus for treating a substrate includes a substrate support unit to support the substrate, and a liquid supplying unit to supply a liquid to a substrate supported by the substrate support unit. The liquid supplying unit includes a nozzle to discharge the liquid, a liquid supplying line to supply the liquid to the nozzle, a constant pressure valve installed on the liquid supplying line, a shut-off valve installed on the liquid supplying line while being interposed between the constant pressure valve and the nozzle to supply the liquid or to stop the supply of the liquid, and a controller to control the constant pressure valve and the shut-off valve.

4 Claims, 7 Drawing Sheets

(RELATED ART)

APPARATUS AND METHOD FOR TREATING SUBSTRATE

CROSS-REFERENCE TO RELATED APPLICATIONS

This application claims priority under 35 U.S.C. § 119 to Korean Patent Application No. 10-2017-0127508 filed on Sep. 29, 2017, in the Korean Intellectual Property Office, the disclosures of which are incorporated by reference herein in their entireties.

BACKGROUND

Embodiments of the inventive concept described herein relate to an apparatus and a method for supplying a liquid.

To fabricate a semiconductor device, various processes, such as a photolithography, etching, ashing, and rinsing processes are performed. The processes are to supply the liquid to a substrate and an amount of the liquid to be supplied is varied depending on the processes.

In general, an apparatus for supplying a liquid supplies the liquid in amount set depending on processes or processing steps. The amount of the liquid is adjusted based on the supply pressure of the liquid. In general, the supply pressure of the liquid is adjusted by a constant pressure valve. FIG. 1 is a sectional view illustrating a conventional constant pressure valve. Referring to FIG. 1, the constant pressure valve includes a body having a fluid passage through which the liquid flows and a diaphragm movable in the fluid passage. The diaphragm is moved by the pressure of the fluid passage.

As the liquid is supplied, the pressure of the fluid passage is lowered and the diaphragm is moved such that the fluid passage is open. In contrast, when the supply of the liquid is stopped, the pressure of the fluid passage is increased and the diaphragm is moved such that the fluid passage is closed.

However, at the time point that the supply of the liquid is stopped, collision may occur between the body and the diaphragm. The discharge and the stop of the liquid are repeatedly performed several hundreds of times to several thousands of times when multiple sheets of substrates are treated. Accordingly, the collision between the body and the diaphragm is repeated, and a large amount of particles are produced during the collision.

These particles are supplied to the substrate together with the liquid to contaminate the substrate and to cause the process failure.

SUMMARY

Embodiments of the inventive concept provide an apparatus and a method for preventing particles from being produced when adjusting a constant pressure valve.

According to an exemplary embodiment, there are provided an apparatus and a method for treating a substrate.

The apparatus for treating the substrate includes a substrate support unit to support the substrate and a liquid supplying unit to supply a liquid to a substrate supported by the substrate support unit. The liquid supplying unit includes a nozzle to discharge the liquid, a liquid supplying line to supply the liquid to the nozzle, a constant pressure valve installed on the liquid supplying line, a shut-off valve installed on the liquid supplying line between the constant pressure valve and the nozzle to supply the liquid or to stop the supply of the liquid, and a controller to control the constant pressure valve and the shut-off valve. The controller performs a control operation such that the shut-off valve is closed and the constant pressure valve is closed after discharge of the liquid of the nozzle is stopped.

The constant pressure valve may include a body having a fluid passage through which the liquid flows, a diaphragm to open or close the fluid passage, and a fluid supply member to apply fluid pressure or air pressure to move the diaphragm.

A position of the diaphragm may be moved by pressure of the liquid supplying line, and the controller may control the fluid supply member such that the diaphragm is in non-contact with the body when the shut-off valve is closed.

The fluid passage may extend in a vertical direction, and may include an adjusting passage into which the diaphragm is inserted. The liquid supplying line may include a first line positioned farther away from the shut-off valve when positioned based on the constant pressure valve and connected with a lower end portion of the fluid passage, and a second line positioned closer to the shut-off valve when positioned based on the constant pressure valve and connected with an upper end portion of the fluid passage. The controller may control the fluid supply member to prevent the diaphragm from being lifted in a direction of closing the fluid passage by pressure of the second line when the shut-off valve is closed. The controller may control the fluid supply member to apply first pressure to the diaphragm when the liquid of the nozzle is discharged and to apply second pressure to the diaphragm when or after the discharge of the liquid of the nozzle is stopped, and the second pressure may be higher than the first pressure.

The diaphragm may include an insertion shaft including a body part positioned to be inserted into the adjusting passage and a locking part extending from a lower end of the body part and having a diameter greater than a diameter of the adjusting passage, a top plate fixedly coupled to an upper end of the insertion shaft and having a diameter greater than a diameter of the adjusting passage, a pressurizing shaft extending upward from the top plate, and an elastic member to support the pressurizing shaft to apply elastic force in a vertical direction. The second pressure may be greater than a sum of the elastic force and pressure of the second line.

According to another exemplary embodiment, a method for performing liquid treatment for a substrate may include supplying a liquid to the substrate by a nozzle as the nozzle is connected with a liquid supplying line having a constant pressure valve and a shut-off valve sequentially mounted on the liquid supplying line in a direction that the liquid is supplied, and opening the constant pressure valve when the shut-off valve is closed as supply of the liquid from the nozzle is completed.

The constant pressure valve may have a body formed therein with a fluid passage allowing a liquid to flow therein and moves a diaphragm to open or close the fluid passage, and the diaphragm may be maintained in non-contact with the body when the shut-off valve is open or closed. First pressure may be applied to provide driving force to the diaphragm such that the diaphragm opens the fluid passage while the shut-off valve is open, and second pressure may be applied to provide driving force to the diaphragm such that the diaphragm opens the fluid passage while the shut-off valve is closed. The second pressure is greater than the first pressure.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
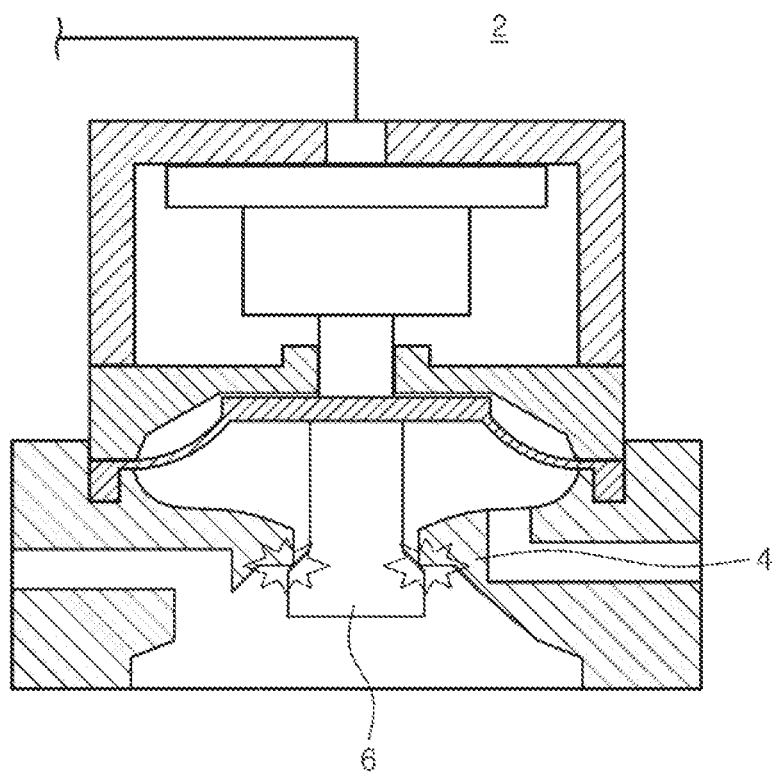
FIG. 1 is a sectional view illustrating a conventional constant pressure valve.

The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Hereinafter, an embodiment of the inventive concept will be described with reference to FIGS. 2 to 7.

Figure 2:
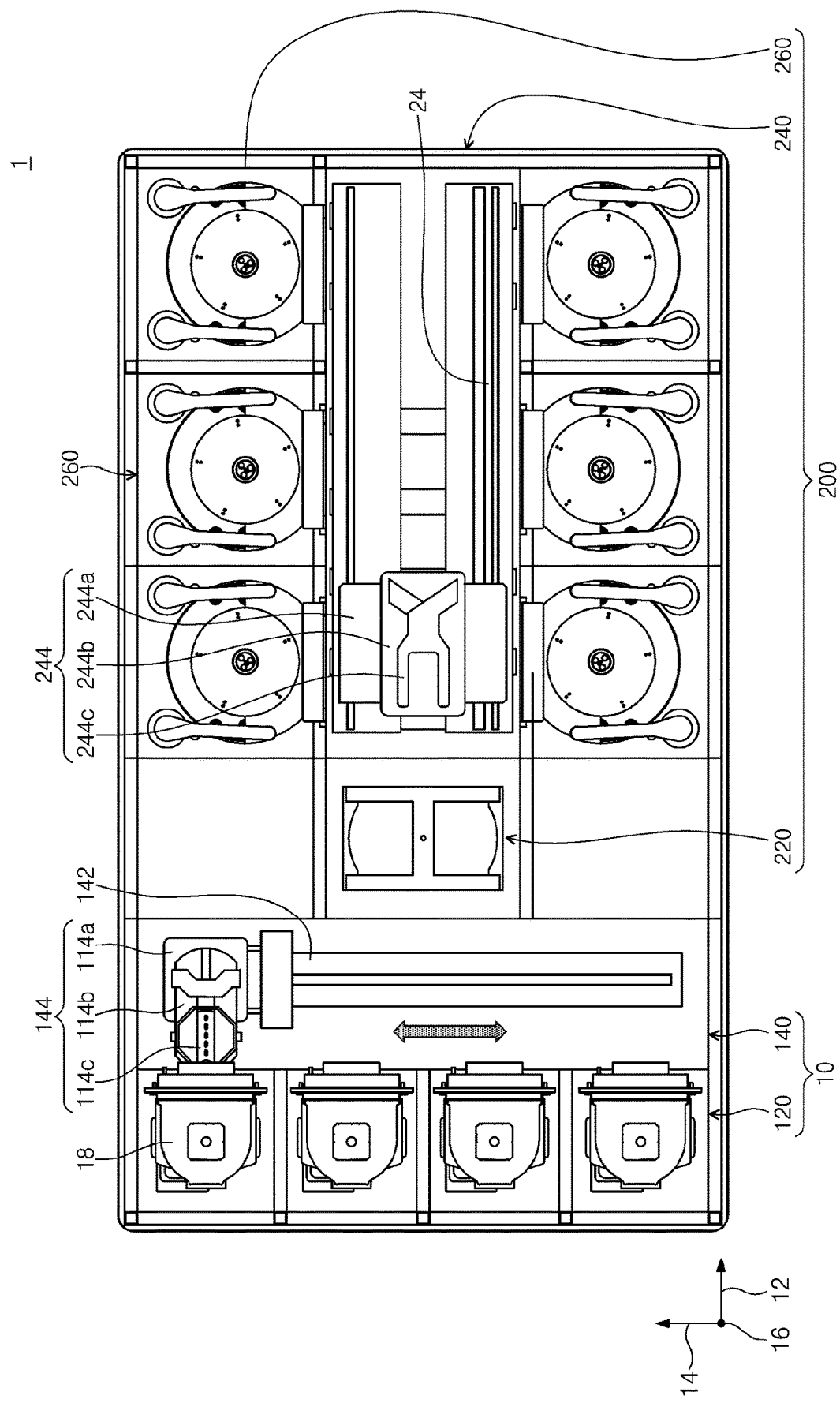
FIG. 2 is a plan view illustrating a substrate treating facility, according to an embodiment of the inventive concept.

FIG. 2 is a plan view illustrating a substrate treating facility, according to an embodiment of the inventive concept.

Referring to FIG. 2, a substrate treating facility 1 has an index module 10 and a process treating module 20, and the index module 10 includes a load port 120 and a feeding frame 140. The load port 120, the feeding frame 140, and the process treating module 20 may be sequentially arranged in a row. Hereinafter, a direction in which the load port 120, the feeding frame 140, and the process treating module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18 having a substrate W received therein is seated on the load port 120. A plurality of load ports 120 are provided, and are arranged in the second direction 14 in a line. FIG. 1 illustrates that four load ports 120 are provided. However, the number of the load ports 120 may increase or decrease depending on a condition, such as the process efficiency of the process treating module 20 or a footprint. A slot (not illustrated) is formed in the carrier 18 to support the edge of the substrate. A plurality of slots are provided in the third direction 16, and substrates are positioned in the carrier 18 such that the substrates are stacked in the third direction 16 while being spaced apart from each other. A front opening unified pod (FOUP) may be used as the carrier 18.

The process treating module 20 includes a buffer unit 220, a feeding chamber 240, and a process chamber 260. The feeding chamber 240 is disposed such that the lengthwise direction thereof is in parallel to the first direction 12. Process chambers 260 are arranged at opposite sides of the feeding chamber 240. The process chambers 260 may be provided symmetrically to each other about the feeding chamber 240. Some of the process chambers 260 are arranged in the lengthwise direction of the feeding chamber 240. Furthermore, others of the process chambers 260 are arranged to be stacked on each other. In other words, the process chambers 260 may be arranged in the form of a matrix of A×B (A and B are natural numbers) at one side of the feeding chamber 240. In this case, A is the number of the process chambers 260 aligned in a line in the first direction 12, and B is the number of the process chambers 260 aligned in a line in the third direction 16. When four or six process chambers 260 are provided at one side of the feeding chamber 240, the first process chambers 260 may be arranged in 2×2 or 3×2. The number of the process chambers 260 may increase or decrease.

Unlikely, the process chambers 260 may be provided at any one side of the transfer chamber 240. In addition, the process chamber 260 may be provided in a single layer at one side and an opposite side of the feeding chamber 240. In addition, unlike the above description, the process chambers 260 may be provided in various arrangements.

The buffer unit 220 is interposed between a feeding frame 140 and the feeding chamber 240. The buffer unit 220 provides a space in which the substrate W stays before the substrate is carried between the feeding chamber 240 and the feeding frame 140. The buffer unit 220 is provided therein with a slot (not illustrated) in which the substrate W is placed and a plurality of slots (not illustrated) are spaced apart from each other in the third direction 16. The buffer unit 220 is open in surfaces facing the feeding frame 140 and the feeding chamber 240.

The feeding frame 140 carries the substrate "W" between the carrier 18 seated in the load port 120 and the buffer unit 220. An index rail 142 and an index robot 144 are provided in the feeding frame 140. The index rail 142 is provided such that the lengthwise direction thereof is in parallel to the second direction 14. The index robot 144 is installed on the index rail 142 to be linearly moved in the second direction 14 along the index rail 142. The index robot 144 may contain a base 114a, a body 114b, and an index arm 114c. The base 114a may be installed to be movable along the index rail 142. The body 114b may be joined to the base 114a. The body 114b is provided to be movable on the base 114a in the third direction. Furthermore, the body 114b may be provided to be rotatable on the base 114a. The index arm 114c may be joined to the body 114b such that it is forward and backward movable with respect to the body 114b. The index arm 114c may be provided in plurality, and the plurality of index arms 114c may be driven independently of each other. The index arms 114c may be arranged to be stacked on each other under the state that index arms 114c are spaced apart from each other along the third direction 16. Some of the index arms 114c are used when carrying the substrates "W" to the carrier 18 from the process treating module 20, and some of the index arms 114c may be used when carrying the substrates W from the carrier 18 to the process treating module 20. This structure may prevent particles, which are produced from the substrates "W" before the process treatment, from sticking to the substrates "W" after the process treatment in the process that the index robot 144 introduces and withdraws the substrates "W" into and out.

The feeding chamber 240 transfers the substrate W between the buffer unit 220 and the process chambers 260. A guide rail 242 and a main robot 244 are provided in the feeding chamber 240. The guide rail 242 is disposed such that the lengthwise direction thereof is parallel to the first direction 12. The main robot 244 is installed on the guide rail 242 to linearly move in the first direction 12 on the guide rail 242.

The process chamber 260 may sequentially perform a process on one substrate W. For example, the substrate W may be subject to a chemical process, a rinse process, and a drying process in the process chamber 260.

Figure 3:
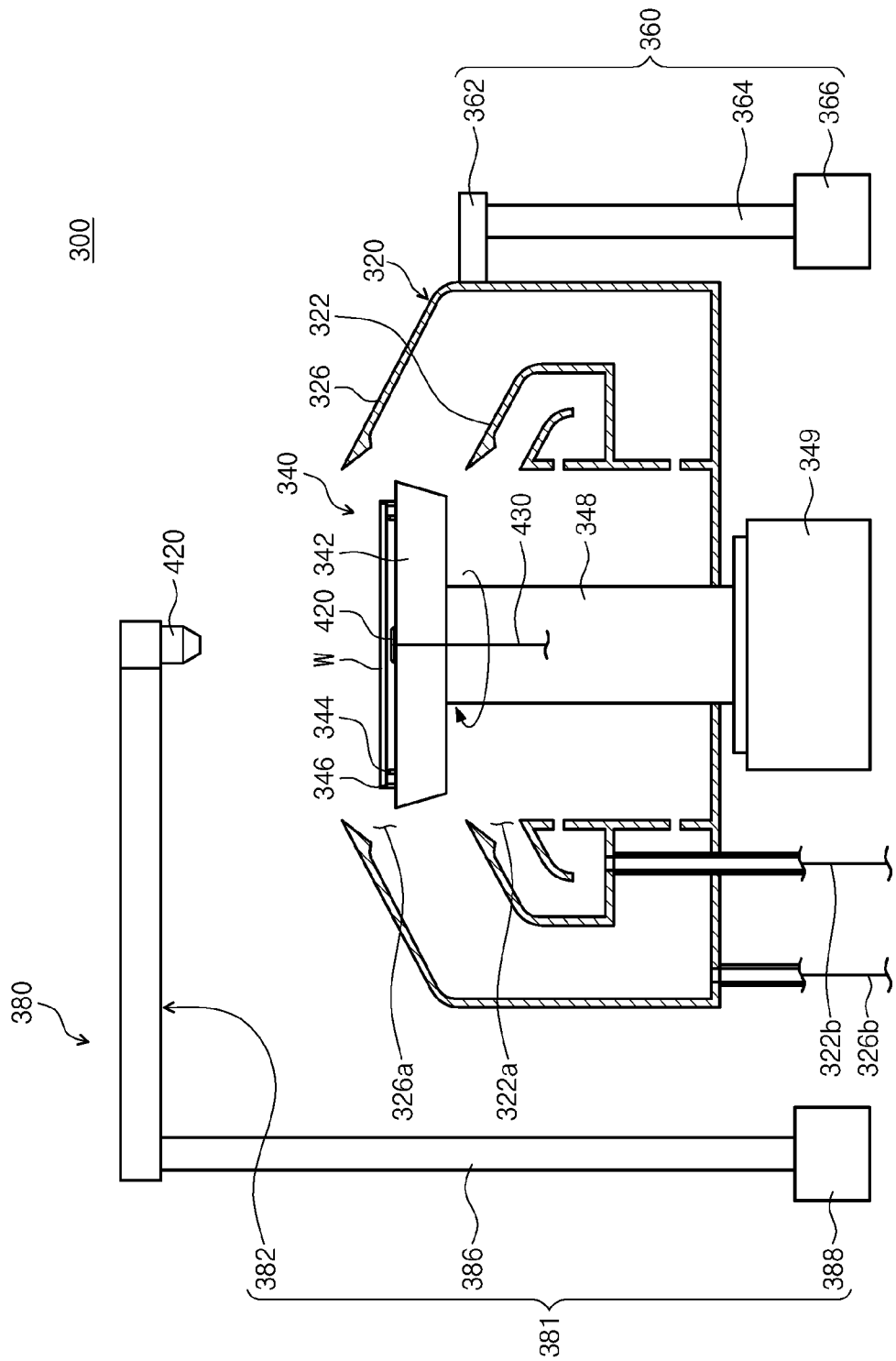
FIG. 3 is a sectional view illustrating an apparatus for treating the substrate in FIG. 2.

Hereinafter, an apparatus 300 for treating the substrate, which is provided in the process chamber 260, will be described. FIG. 3 is a sectional view illustrating the substrate treatment device of FIG. 2. Referring to FIG. 3, the apparatus for treating the substrate may include a treatment container 320, a spin head 340, an elevation unit 360, and a liquid supplying unit 380.

The treatment container 320 provides a treatment space for performing a process of treating the substrate W. The treatment container 320 is provided in the shape of a cup having an open upper portion. The treatment container 320 includes an inner recovery vessel 322 and an outer recovery vessel 326. The recovery vessels 322 and 326 collect mutually different treatment liquids among treatment liquids used in the process. The inner recovery vessel 322 is provided to have an annular ring shape for surroundings the spin head 340, and the outer recovery vessel 326 is provided to have an annular ring shape for surrounding the inner recovery vessel 322. An inner space 322a of the inner recovery vessel 322 and a space 326a between the outer recovery vessel 326 and the inner recovery vessel 322 function as inlets for introducing the treatment liquids into the inner recovery vessel 322 and the outer recovery vessel 326, respectively. Recovery lines 322b and 326b are connected to the recovery vessels 322 and 326 while vertically extending downward from the bottom surfaces of the recovery vessels 322 and 326. The recovery lines 322b and 326b are to discharge the treatment liquids introduced into the recovery vessels 322 and 326, respectively. The discharged treatment liquids may be recycled through an external treatment liquid recycling system (not illustrated).

The spin head 340 serves as a substrate support unit 340 to support and rotate the substrate W. The spin head 340 is disposed inside the treatment space of the treatment container 320. The spin head 340 rotates the substrate "W" while supporting the substrate "W" during the process. The spin head 340 has a body 342, a support pin 344, a chuck pin 346, and a support shaft 348. The body 342 has a top surface provided in a substantially circular shape when viewed from the top. The support shaft 348 is fixedly coupled to the bottom surface of the body 342 to be rotatable by a motor 349. A plurality of support pins 344 may be provided. The support pins 344 may be disposed to be spaced apart from an edge of the top surface of the body 342 by a predetermined gap and may protrude upward from the body 342. The support pins 344 are arranged to substantially have an annular ring shape through combination thereof. The support pins 344 support an edge of a bottom surface of the substrate "W" such that the substrate "W" is spaced apart from the top surface of the body 342 by a specific distance. A plurality of chuck pins 346 are provided. The chuck pins 346 may be disposed to be farther away from the center of the body 342 than the support pins 344. The chuck pins 346 are provided to protrude upward from the body 342. The chuck pins 346 support side portions of the substrate "W" such that the substrate "W" does not laterally deviate from a right position thereof when the spin head 340 rotates. The chuck pins 346 are provided to be straightly movable between a standby position and a support position in a radial direction of the body 342. The standby position is farther apart from the center of the body 342 than the support position. When the substrate W is loaded onto on or unloaded from the spin head 340, the chuck pins 346 are positioned at the standby position. When a process is performed with respect to the substrate W, the chuck pins 346 are positioned at the support position. The chuck pins 346 are in contact with the side portions of the substrate "W" at the support position.

The elevation unit 360 may adjust the relative height between the treatment container 320 and the substrate W. The elevation unit 360 straightly moves the treatment container 320 upward and downward. As the treatment container 320 moves upward and downward, a relative height of the treatment container 320 to the spin head 340 is changed. The elevation unit 360 has a bracket 362, a moving shaft 364, and a driver 366. The bracket 362 is fixedly installed on an outer wall of the treatment container 320, and the moving shaft 364 is fixedly coupled to the bracket 362 to move upward and downward by the driver 366. When the substrate "W" is placed on the spin head 340 or lifted from the spin head 340, the treatment container 320 moves downward such that the spin head 340 protrudes upward from the treatment container 320. The height of the treatment container 320 is adjusted such that the treatment liquid is introduced into the recovery vessel preset depending on the type of the treatment liquid supplied to the substrate "W" when the process is performed.

Unlike the above description, the elevation unit 360 may move the spin head 340 upward and downward instead of the treatment container 320.

The liquid supplying unit 380 may supply the treatment liquid onto the substrate W. A plurality of liquid supplying units 380 may be provided to supply mutually different types of liquids. The liquid supplying unit 380 includes a driving member 381 and a fluid supply member 400.

The driving member 381 moves, between a process position and the standby position, a nozzle 420 of the fluid supply member 400. The process position is a position at which the nozzle 420 is disposed at a vertical upper portion of the treatment container 320 in a vertical direction, and the standby position is a position that the nozzle 420 is out of the vertical upper portion of the treatment container 320. According to an embodiment, the process position may be a position at which the nozzle 420 supplies the treatment liquid to the center of the substrate W. The driving member 381 has an arm 382, a support shaft 386, and a driver 388. The support shaft 386 may be disposed at one side of the treatment container 320. The support shaft 386 has a lengthwise direction which is the third direction 16, and the driver 388 is coupled to a lower end of the support shaft 386. The driver 388 rotates and lifts the support shaft 386. The arm 382 is fixedly coupled to the upper end of the support shaft 386. The arm 382 has a lengthwise direction perpendicular to the support shaft 386.

The fluid supply member 400 includes a nozzle 420, a liquid supplying line 440, a shut-off valve 460, a flow control valve 500, and a controller 480.

The nozzle 420 discharges the treatment liquid. The nozzle 420 is installed on the bottom surface of the end of the arm 382. The nozzle 420 moves together with the arm 382 as the support shaft 386 rotates. For example, the treatment liquid may include chemicals, a rinse liquid, and a drying fluid. The chemicals may be a liquid having a strong acid or alkali property. The rinsing liquid may be pure water. The drying fluid may be isopropyl alcohol (IPA).

Figure 4:
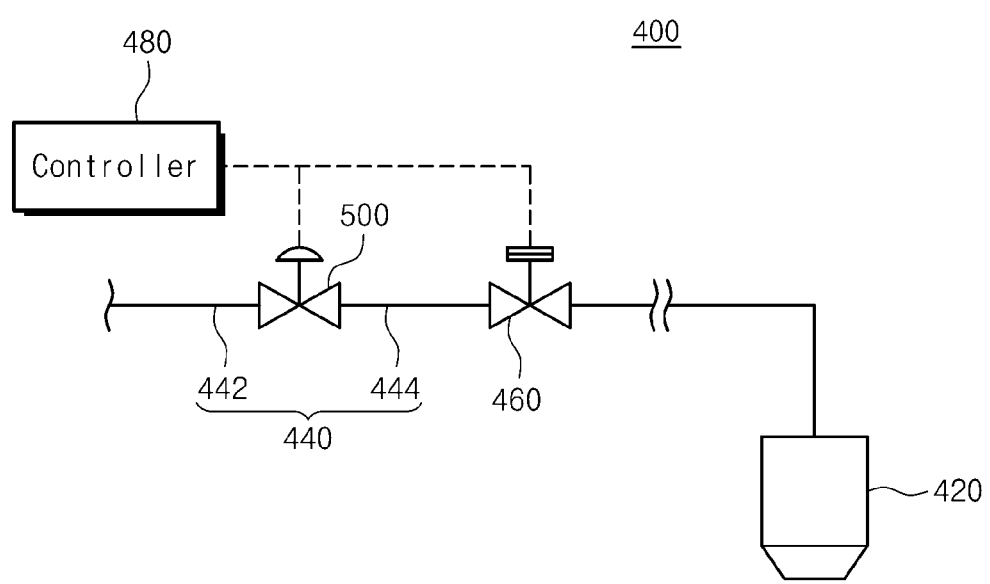
FIG. 4 is a sectional view illustrating a fluid supply member of FIG. 3 depending on the discharge state of the liquid.
Figure 5:
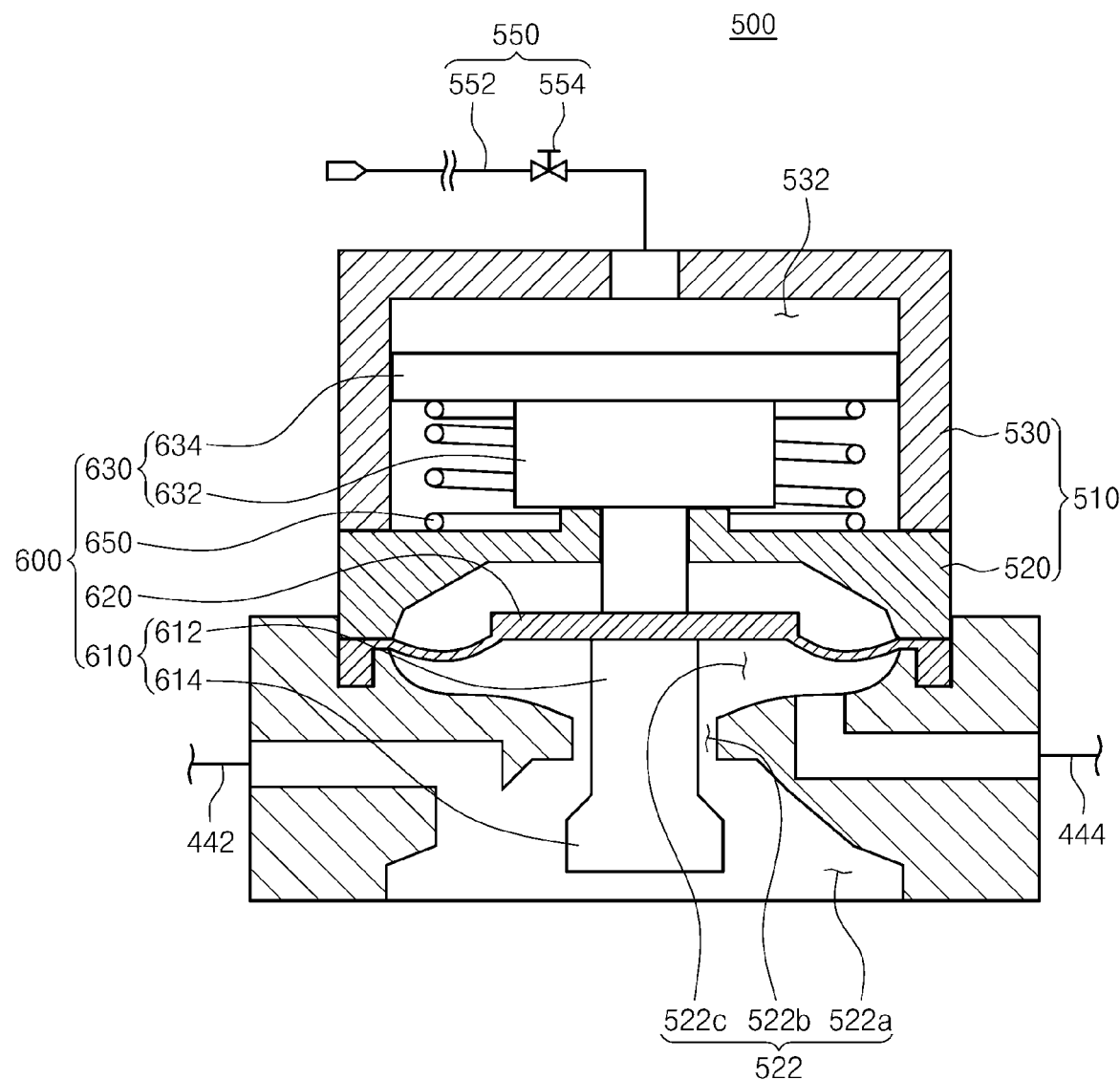
FIG. 5 is a sectional view illustrating the constant pressure valve of FIG. 4 depending on the discharge state of the liquid.
Figure 6:
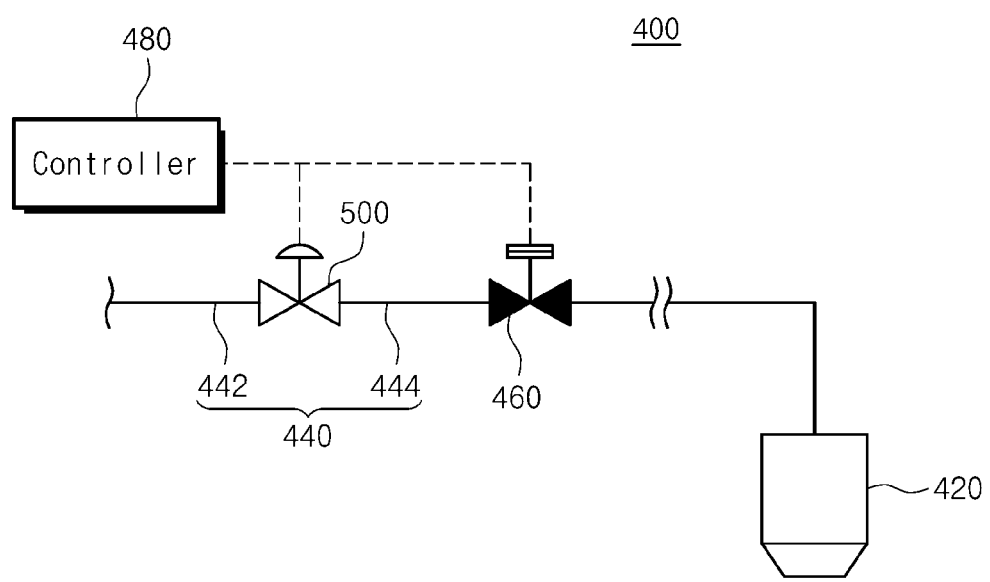
FIG. 6 is a sectional view illustrating the fluid supply member of FIG. 3 depending on the discharge stop state of the liquid.
Figure 7:
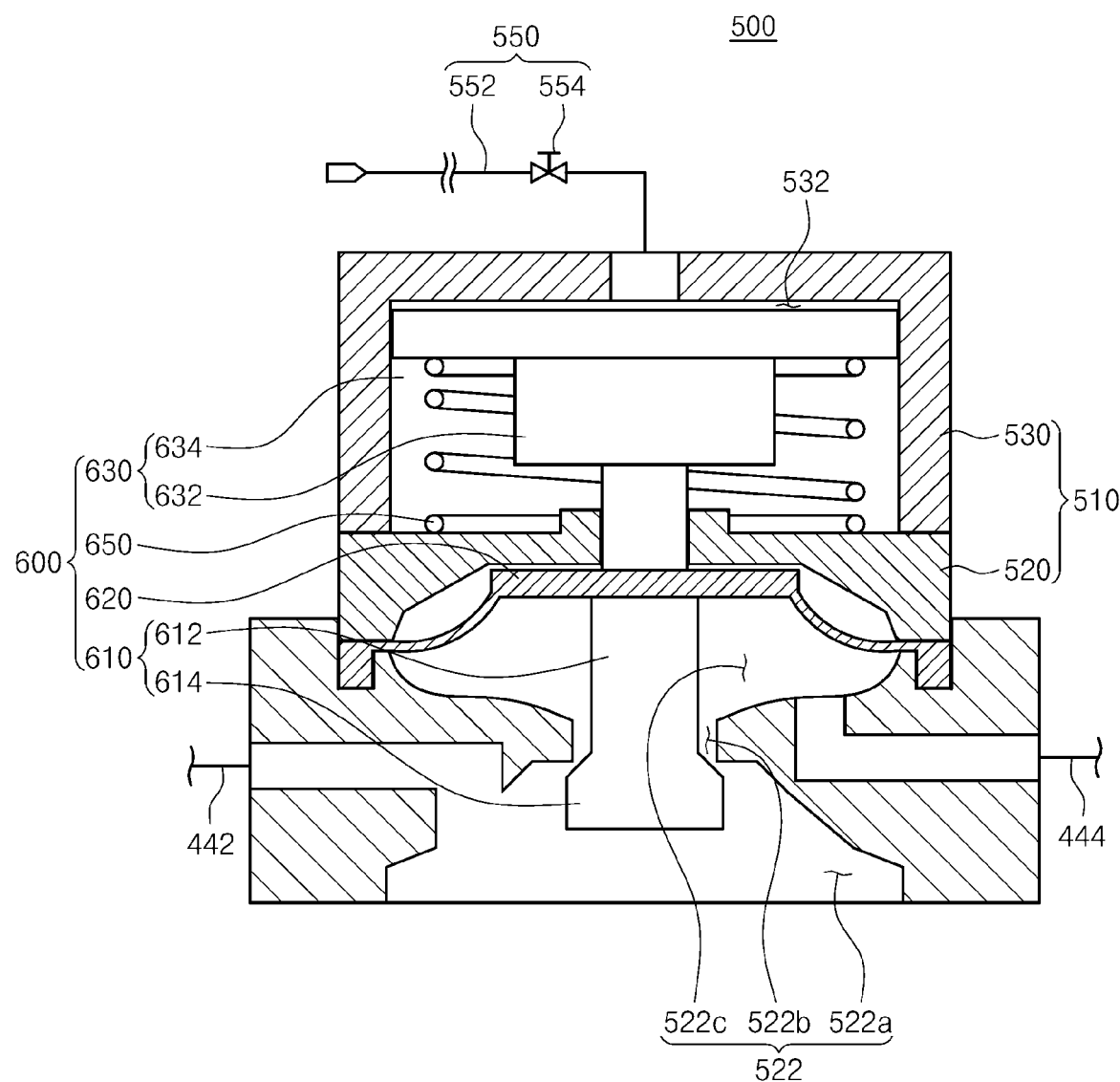
FIG. 7 is a sectional view of the constant pressure valve of FIG. 6 depending on the discharge stop state of the liquid.

FIG. 4 is a sectional view of the fluid supply member of FIG. 3 depending on a liquid discharge state, and FIG. 5 is a sectional view of the constant pressure valve of FIG. 4 depending on the liquid discharge state. FIG. 6 is a sectional view of the fluid supply member of FIG. 3 depending on the stop state of liquid discharge, and FIG. 7 is a sectional view of the constant pressure valve of FIG. 6 depending on the stop state of the liquid discharge. Referring to FIGS. 4 to 7, the liquid supplying line 440 supplies the treatment liquid to the nozzle 420. The shut-off valve 460 and the flow control valve 500 are installed on the liquid supplying line 440. The flow control valve 500 and the shut-off valve 460 are sequentially positioned in the direction of supplying the treatment liquid. In other words, the shut-off valve 460 is positioned closer to the nozzle 420 rather than the flow control valve 500. The liquid supplying line 440 includes a first line 442 and a second line 444. The first line 442 is apart from the shut-off valve 460 when positioned based on the flow control valve 500, and the second line 444 is closer to the shut-off valve 460 when positioned based on the flow control valve 500. Accordingly, the first line 442 and the second line 444 may have mutually pressure sizes by the shut-off valve 460 and the flow control valve 500.

The shut-off valve 460 opens the liquid supplying line 440. The shut-off valve 460 supplies a liquid or stops the supply of the liquid. The flow control valve 500 adjusts an amount of the treatment liquid supplied to the liquid supplying line 440. The flow control valve 500 may adjust the amount of the treatment liquid by adjusting the supply pressure of the treatment liquid. The flow control valve 500 is provided in the form of a constant pressure valve 500.

The constant pressure valve 500 includes a body 510, a fluid supply member 550, and a diaphragm 600. The body 510 has a fluid passage 522 in which a liquid flows. The body 510 includes a lower housing 520 and an upper housing 530. The fluid passage 522 is provided inside the lower housing 520. The fluid passage 522 is provided to face a vertical direction. The fluid passage 522 includes a first passage 522a, a control passage 522b, and a second passage 522c. The first passage 522a, the control passage 522b, and the second passage 522c are sequentially positioned upward. The first passage 522a is provided to communicate from the first line 442 to the bottom of the control passage 522b and the second passage 522c is provided from the top of the control passage 522b to the second line 444. In other words, the treatment liquid may be supplied to the nozzle 420 by sequentially passing through the first line 442, the first passage 522a, the control passage 522b, the second passage 522c, and the second line 444. The control passage 522b has a width narrower than widths of the first passage 522a and the second passage 522c. The control passage 522b serves as a passage for adjusting the supply pressure of the treatment liquid.

The upper housing 530 is positioned to be stacked on the lower housing 520. The upper housing 530 is positioned on the lower housing 520. A pressurized space 532 is formed inside the upper housing 530. The pressurized space 532 is provided as a space in which the diaphragm 600 positioned inside the body 510 is adjusted. A through hole is formed in one surface allowing the upper housing 530 to face the lower housing 520. The second passage 522c and the pressurized space 532 may communicate with each other by the through hole.

The fluid supply member 550 pressurizes the pressurized space 532. The fluid supply member 550 includes a fluid supply line and a fluid valve. The liquid supplying line is connected with the pressurized space 532. The fluid supply line supplies a fluid to the pressurized space 532. The fluid valve controls an amount of the fluid supplied to the fluid supply line. For example, the fluid valve may variously control the amount of the fluid depending on the liquid discharge state of the nozzle 420. The fluid supply member 550 may move the diaphragm 600 by applying fluid pressure or air pressure to the pressurized space 532.

The diaphragm 600 closes the fluid passage 522. For example, the diaphragm 600 controls the supply pressure of the treatment liquid by opening or closing the control passage 522b. The diaphragm 600 includes an insertion shaft 610, a top plate 620, a pressurizing shaft 630, and an elastic member 650. The insertion shaft 610 is positioned such that the insertion shaft 610 is inserted into the control passage 522b. The insertion shaft 610 has a lengthwise direction extending in the vertical direction. The insertion shaft 610 has a body part 612 and a locking part 614. The body part 612 is positioned such that the body part 612 is inserted into the control passage 522b and has the shape of a rod extending in the vertical direction. The body part 612 is provided to have the width narrower than the width of the control passage 522b. The locking part 614 is positioned in the first passage 522a. The locking part 614 is provided to extend from the lower end of the body part 612. The locking part 614 is provided to have a width wider than the width of the control passage 522b. Accordingly, the locking part 614 may prevent the body part 612 from being lifted to more than a predetermined height.

The top plate 620 is fixedly coupled to the upper end of the support shaft 610. The top plate 620 is positioned in the second passage 522c. The upper end is provided to have an area sufficient to divide the second passage 522c. Accordingly, the fluid passage 522, through which the treatment liquid flows, is provided under the top plate 620 and the treatment liquid is not provided above the top plate 620.

The pressurizing shaft 630 is moved in the vertical direction by the air pressure or the fluid pressure applied to the pressurized space 532. The top plate 620 and the insertion shaft 610 are moved together with the pressurizing shaft 630. The pressurizing shaft 630 has a through part 632 and a pressurizing part 634. The through part 632 has the length direction extending in the vertical direction. The through part 632 has the shape of a rod. The through part 632 is provided to extend upward from the top plate 620. The through part 632 is positioned to be inserted into the through hole. In other words, the lower end of the through part 632 is positioned in the second passage 522c and the upper end of the through part 632 is positioned in the pressurized space 532. The pressurizing part 634 has the shape of a plate extending from the upper end of the through part 632. The pressurizing part 634 is positioned in the pressurized space 532.

The elastic member 650 supports the pressurizing shaft 630 in the pressurized space 532. The elastic member 650 applies elastic force to the pressurizing shaft 630 in the vertical direction. The elastic member 650 is fixedly coupled to the bottom surface of the pressurizing part 634 and the floor of the upper housing 530. Accordingly, the elastic member 650 may prevent the pressurizing shaft 630 from being dropped down to a specific height or less by pressure applied to the pressurized space 532. For example, the elastic member 650 may include a spring 650.

The controller 480 controls the flow control valve 500 and the shut-off valve 460. When the treatment liquid is discharged from the nozzle 420, the controller 480 opens the shut-off valve 460 and the flow control valve 500. When the discharge of the treatment liquid is stopped from the nozzle 420, the controller 480 closes the shut-off valve 460 and opens the flow control valve 500. The controller 480 controls the fluid supply member 550 such that the locking part 614 is not in contact with the body 510 when the discharge of the treatment liquid is stopped.

When the shut-off valve 460 is closed, the pressure of the second line 444 is amplified to be more than the pressure of the first line 442. In this case, the insertion shaft 610 is lifted due to the pressure difference between the first line 442 and the second line 444, and the locking part 614 may collide with the body 510 defining the control passage 522b. In this case, the controller 480 may control the fluid supply member 550 such that the fluid is supplied to the pressurized space 532. Accordingly, the locking part 614 may be prevented from colliding with the body 510.

In detail, while the shut-off valve 460 is open, a fluid having first pressure may be applied to the pressurized space 532. While the shut-off valve 460 is closed, a fluid having second pressure may be applied. The second pressure is provided to be higher than the first pressure. The second pressure may be greater than the sum of the elastic force of the elastic member 650 and the pressure of the second line 444. Accordingly, the locking part 614 is prevented from colliding with the body 510 as the insertion shaft 610 is lifted.

In the above embodiment, description has been made in that while the process treatment for the substrate W is performed, the fluid having the first pressure is applied in the state that the treatment liquid is discharged, and the fluid having the second pressure is applied in the state that the discharge of the treatment liquid is stopped. However, since the discharge of the nozzle 420 is stopped even in the state that the process for the substrate W is in an idle state, the shut-off valve 460 may be closed and the fluid having the second pressure may be applied to the pressurized space 532.

According to an embodiment of the inventive concept, pressure greater than the pressure of the fluid passage is applied to the diaphragm. Accordingly, the collision between the body and the diaphragm may be prevented.

In addition, according to an embodiment of the inventive concept, since the collision between the body and the diaphragm is prevented, the particles may be prevented from being produced due to the collision.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed:

1. An apparatus for treating a substrate, the apparatus comprising:
    a substrate support unit to support the substrate; and
    a liquid supplying unit to supply a liquid to a substrate supported by the substrate support unit;
    wherein the liquid supplying unit includes:
    a nozzle to discharge the liquid;
    a liquid supplying line to supply the liquid to the nozzle;
    a constant pressure valve installed on the liquid supplying line, wherein the constant pressure valve comprises a diaphragm that can open and close a fluid passage through which the liquid can flow, wherein the diaphragm comprises a locking part that physically contacts a portion of the valve when the fluid passage is closed, and wherein the constant pressure valve comprises a fluid supply member configured to apply fluid pressure or air pressure to move the diaphragm and its locking part;
    a shut-off valve installed on the liquid supplying line while being interposed between the constant pressure valve and the nozzle to supply the liquid or to stop the supply of the liquid; and
    a controller configured to control the constant pressure valve and the shut-off valve, and
    wherein the controller is configured to have the fluid supply member of the constant pressure valve supply fluid or air at a first pressure when the shut-off valve is opened, wherein the controller is configured to have the fluid supply member supply fluid or air at a second pressure when the shut-off valve is closed, and wherein the second pressure is greater than the first pressure such that the locking part does not close the fluid passage of the constant pressure valve in response to the shut-off valve being closed.

2. The apparatus of claim 1, wherein the fluid passage extends in a vertical direction, and includes an adjusting passage into which the diaphragm is inserted, and
    wherein the liquid supplying line includes:
    a first line connected to an input of the constant pressure valve and connected with a lower end portion of the fluid passage; and
    a second line connected to an output of the constant pressure valve and connected with an upper end portion of the fluid passage, and
    wherein the controller controls the fluid supply member to prevent the diaphragm from being lifted up and down in a direction of closing the fluid passage by pressure of the second line when the shut-off valve is closed.

3. The apparatus of claim 2, wherein the diaphragm includes:
    an insertion shaft including a body part positioned to be inserted into the adjusting passage, wherein the locking part extends from a lower end of the body part and has a diameter greater than a diameter of the adjusting passage;
    a top plate fixedly coupled to an upper end of the insertion shaft and having a diameter greater than a diameter of the adjusting passage;
    a pressurizing shaft extending upward from the top plate; and
    an elastic member to support the pressurizing shaft and to apply elastic force in a vertical direction, and
    wherein the second pressure is greater than a sum of an elastic force of the elastic member and pressure of the second line.

4. A method for performing liquid treatment using the apparatus for treating a substrate recited in claim 1, the method comprising:
    supporting the substrate on the substrate support;
    supplying liquid to the substrate by the nozzle while the constant pressure valve and shut-off valve are opened; and
    closing the shut-off valve to stop supplying liquid to the substrate, wherein when the shut-off valve is closed, the controller controls the constant pressure valve such that the fluid supply member supplies fluid or air at a pressure that prevents the locking part from closing the fluid passage of the constant pressure valve in response to the shut-off valve being closed.

* * * * *